United States Patent
Hibbs et al.

(10) Patent No.: US 7,642,016 B2
(45) Date of Patent: Jan. 5, 2010

(54) PHASE CALIBRATION FOR ATTENUATING PHASE-SHIFT MASKS

(75) Inventors: Michael S. Hibbs, Westford, VT (US); Timothy A. Brunner, Ridgefield, NY (US)

(73) Assignee: International Business Machines Corporation, Armonk, NY (US)

( * ) Notice: Subject to any disclaimer, the term of this patent is extended or adjusted under 35 U.S.C. 154(b) by 536 days.

(21) Appl. No.: 11/276,232

(22) Filed: Feb. 20, 2006

(65) Prior Publication Data

US 2007/0196741 A1 Aug. 23, 2007

(51) Int. Cl.
G03F 1/00 (2006.01)
G03C 5/00 (2006.01)

(52) U.S. Cl. ............................................. 430/5; 430/30

(58) Field of Classification Search ...................... 430/5, 430/30, 394; 716/19, 20, 21; 356/604
See application file for complete search history.

(56) References Cited

U.S. PATENT DOCUMENTS

| | | | |
|---|---|---|---|
| 3,728,025 A | 4/1973 | Madigan et al. | |
| 5,053,951 A | 10/1991 | Nusinov et al. | |
| 5,484,672 A | 1/1996 | Bajuk et al. | |
| 5,660,956 A * | 8/1997 | Tomofuji et al. | 430/5 |
| 5,756,235 A | 5/1998 | Kim | |
| 5,817,437 A | 10/1998 | Ahn et al. | |
| 5,932,377 A | 8/1999 | Ferguson et al. | |
| 6,122,056 A | 9/2000 | Hibbs et al. | |
| 6,165,651 A | 12/2000 | Adair et al. | |
| 6,594,003 B1 * | 7/2003 | Horiuchi et al. | 356/73.1 |
| 6,596,448 B2 | 7/2003 | Lai et al. | |
| 6,927,003 B2 | 8/2005 | Kim et al. | |
| 6,951,701 B2 | 10/2005 | Hsu et al. | |
| 7,016,027 B2 * | 3/2006 | Butt et al. | 356/237.1 |

FOREIGN PATENT DOCUMENTS

JP 2001-183812 A 7/2001

* cited by examiner

*Primary Examiner*—Stephen Rosasco
(74) *Attorney, Agent, or Firm*—W. Riyon Harding

(57) ABSTRACT

A phase metrology pattern for attenuating phase masks. The phase error of this pattern can be determined to high accuracy by aerial image measurements. This pattern can be used to create an optical phase standard for calibrating phase metrology equipment for attenuated phase masks, or as a witness pattern on a product mask to verify the phase accuracy of that mask. The pattern includes an effective line to space ratio and can be tested using a microscope or stepper system or can be measured directly using a detector for the 0 order diffraction measurement.

16 Claims, 13 Drawing Sheets

Prior Art

Alternating phase shift mask 100 — Prior Art — Substrate 110

Diffractive Orders 130 — Etched Trenches 120

+1    0    -1

PHASE CALIBRATION FOR ATTENUATING PHASE-SHIFT MASKS

BACKGROUND OF THE INVENTION

1. Field of the Invention

The present invention relates to the development and manufacture of masks for semiconductor fabrication and more specifically to a test structure, method and apparatus for measuring the effective phase of attenuating phase shift masks.

2. Background of the Invention

As metrology tolerances for photomasks become increasingly tight, the issues of measurement methods and calibration standards become more important. This is as true for optical phase metrology as it is for dimensional metrology.

An optical phase standard can be defined using an alternating phase shift mask as shown in FIG. 1. FIG. 1 shows an example of an alternating phase shift mask 100 used for an optical phase standard. Mask 100 is created by etching a step or a trench 120 into a transparent medium substrate 110, for example, fused silica, with a well-characterized index of refraction (as shown in FIG. 2a). The normal-incidence phase shift of such a structure can be calculated from the trench depth and the index of refraction. The measurement accuracy is mainly limited by the ability to measure the physical depth of the trench. The aerial image of such a structure is shown in FIG. 2b.

Other methods exist for measuring optical phase shifts in alternating aperture masks. For example a Levenson grating exhibits symmetrical behavior through focus only if the phase difference between the phase shifted and unshifted openings is exactly 180°.

A measured asymmetry, through focus, between the phase shifted and unshifted clear features in such a grating can be used to quantitatively measure the deviation from 180° optical phase. This approach can use measurements taken on an aerial image metrology system with the numerical aperture and illumination conditions used by the wafer stepper that will eventually project the mask, or actual exposures of wafers on a stepper. However, calibration of optical phase in attenuating phase masks is more difficult and current alternating phase shift calibration methods are inadequate and inaccurate for measuring phase shift in masks with very small structures.

BRIEF SUMMARY OF THE INVENTION

This invention describes a new phase measurement method and structure, which allows the lithographic measurement of the effective phase of an attenuated phase test structure at similar sensitivity to the lithographic methods used for phase measurement of alternating aperture phase masks. The invention described herein is a method and test structure capable of testing for an effective 180° phase differential in small-pitch attenuated phase-shift gratings, wherein the test structure is a pattern etched onto an absorber material (e.g. film) on a mask.

DETAILED DESCRIPTION

Figure 1:
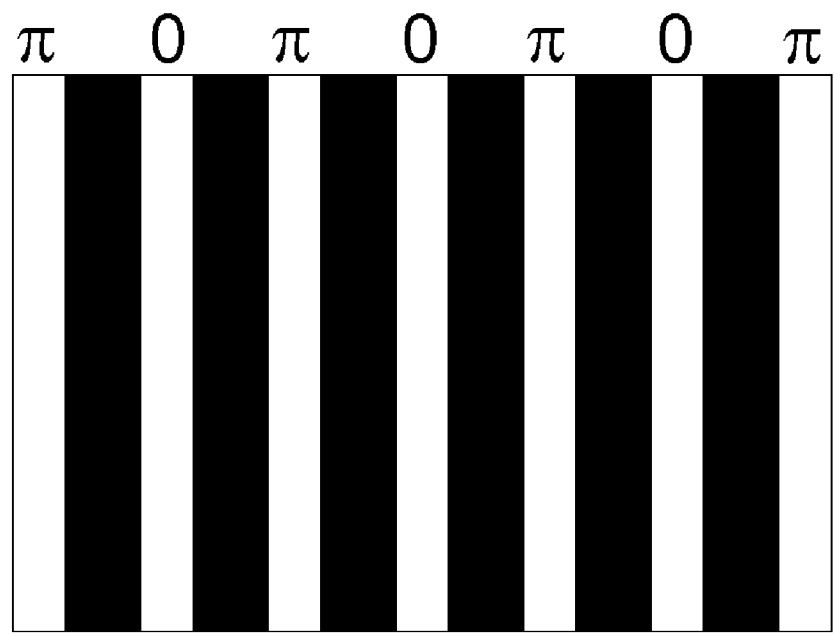
FIG. 1 shows an alternating phase shift mask.
Figure 2A:
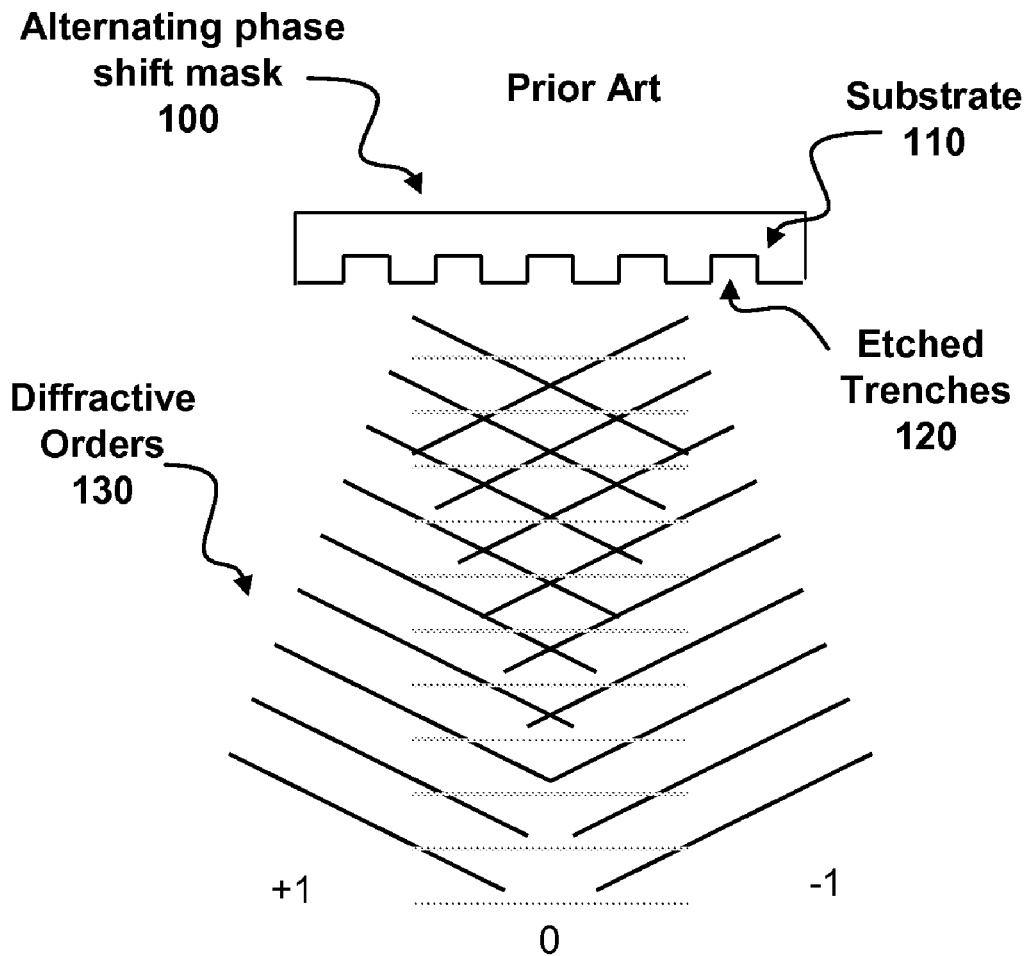
FIG. 2a shows an alternating phase shift mask.
Figure 2B:
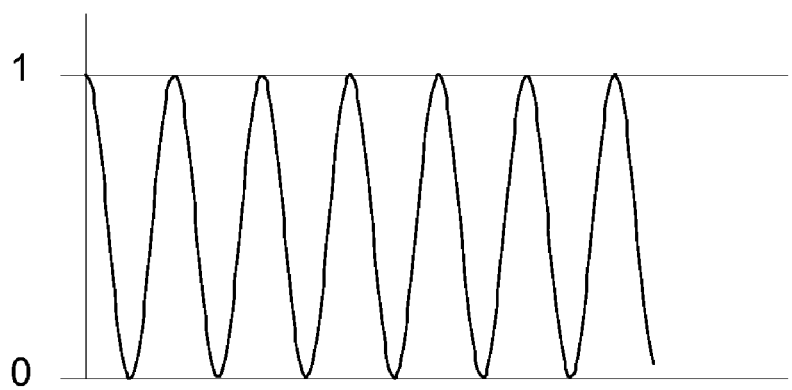
FIG. 2b shows an aerial image formed by the $\pm 1^{st}$ diffraction orders.
Figure 3:
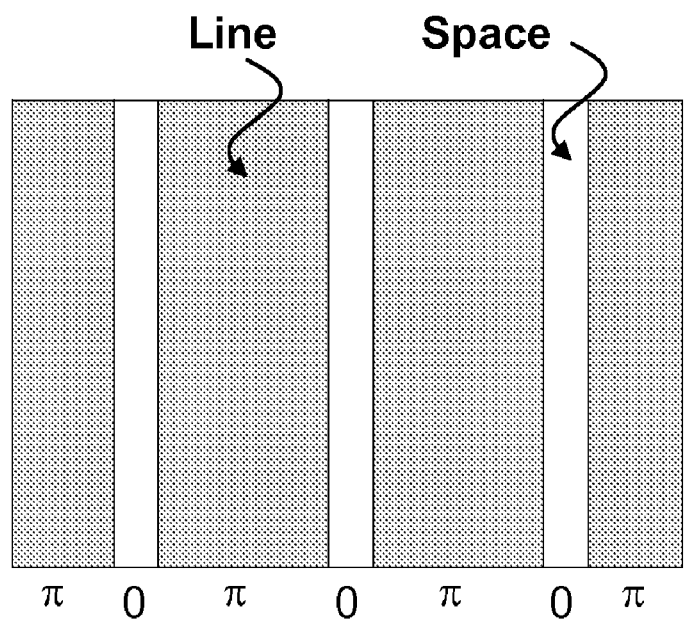
FIG. 3 is an example of an attenuated phase-shift test structure.
Figure 4A:
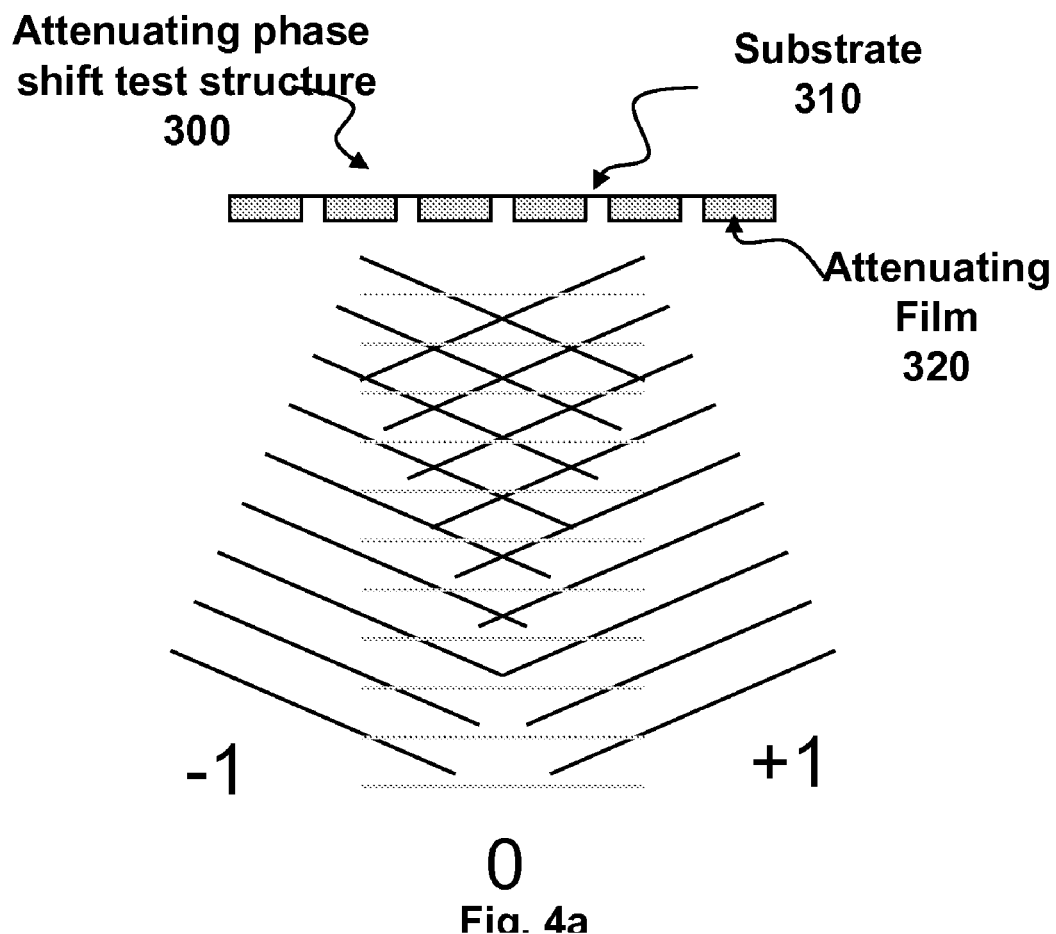
FIG. 4a shows an attenuated phase shift test structure and the zero and $\pm 1^{st}$ diffractive orders.
Figure 4B:
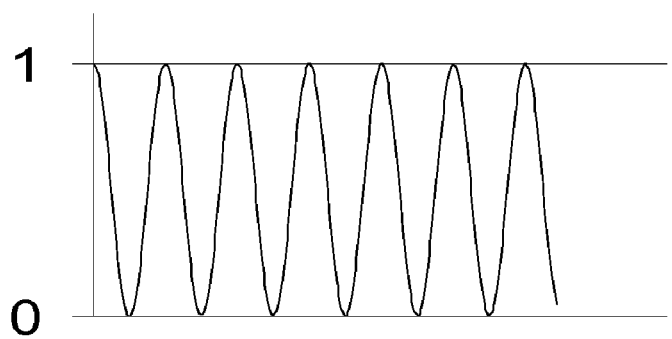
FIG. 4b shows an aerial image of an attenuated phase grating.

FIG. 3 shows an attenuated phase shift test structure 300 of the present invention, wherein the test structure is a pattern etched into an absorber material (e.g. film) on a mask.

Figure 5A:
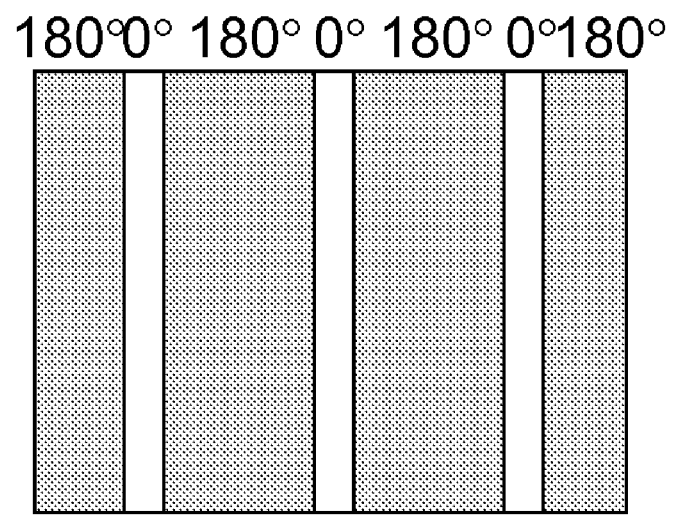
FIG. 5a illustrates an example of attenuating phase shift structure and the corresponding aerial image is shown in FIG. 5b.
Figure 5B:
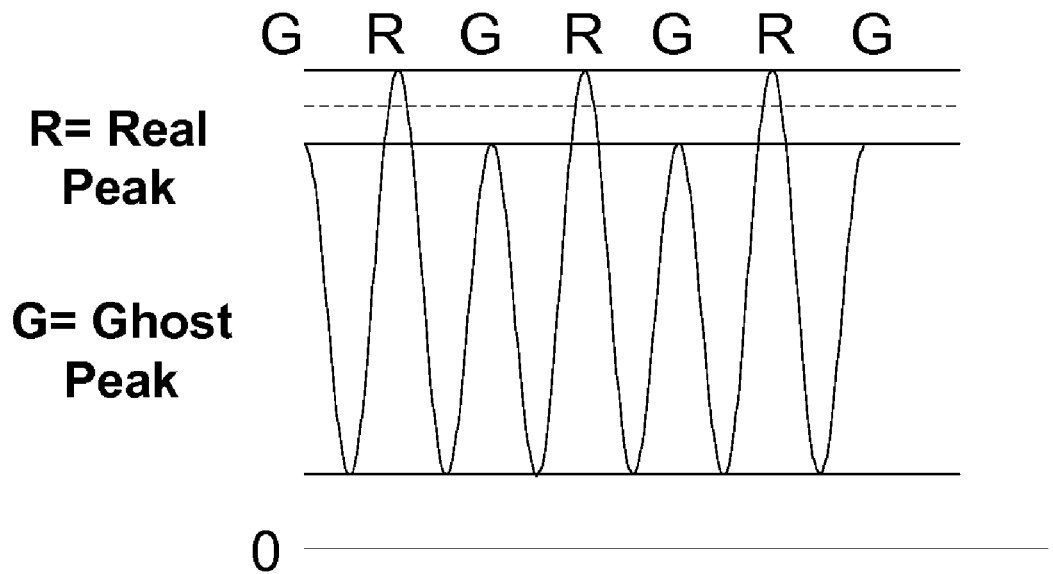

It will appear as though a set of ghost images, shown in FIG. 5b as "G" peaks, has been formed between every pair of clear spaces in the grating as shown in FIG. 5a. These ghost images have the same intensity and width as the real images shown in FIG. 5b as "R" peaks (when there is no phase error); the grating is projected with a doubled spatial frequency. The "R" and "G" peaks are determined by comparing the peaks to the geometries of the grating (as shown in FIG. 5a). I.e. the ghost images "G" are found by comparing the aerial image to the grating. The "G" image is formed centered in the clear spaces of the grating. The "R" images align with the dark spaces of the grating.

Figure 6:
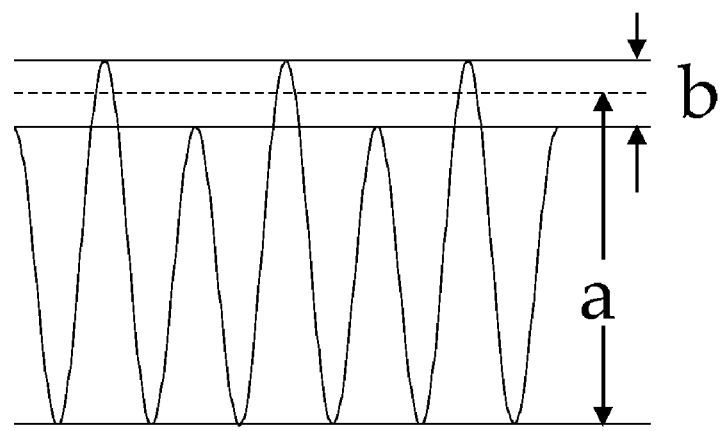
FIG. 6 illustrates an example of an asymmetry parameter for measuring phase differential.

Computer modeling of test structure 300 shows that it has the same sensitivity to phase error as the alternating aperture grating. If the attenuator film 320 has an effective phase that is slightly off from its 180° target, the real images and ghost images in FIG. 5b will no longer have the same peak intensity. The normalized peak intensity difference is defined as the asymmetry parameter, or simply the asymmetry. The asymmetry is defined as the peak difference (b) divided by the average amplitude (a) shown in FIG. 6 and equation 1.

$$\text{Asymmetry} = b/a \qquad \text{(eq. 1)}$$

Figure 7:
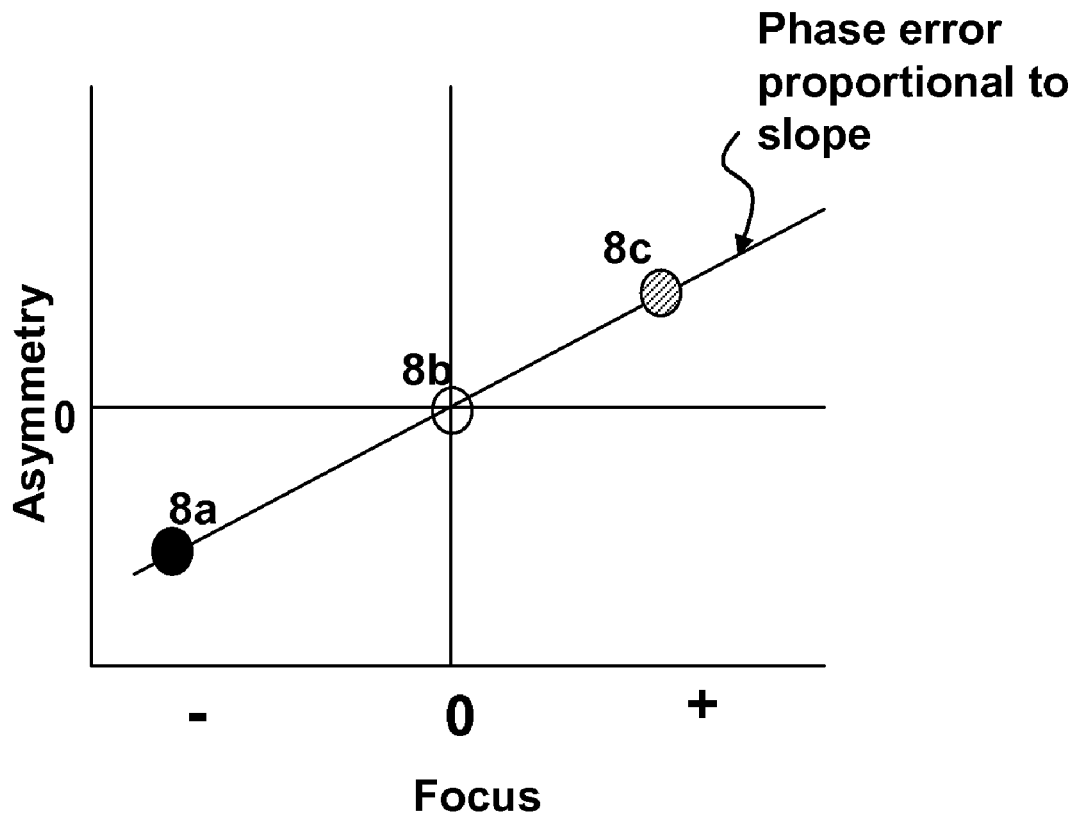
FIG. 7 is a plot of an asymmetry parameter vs. focus.
Figure 8A:
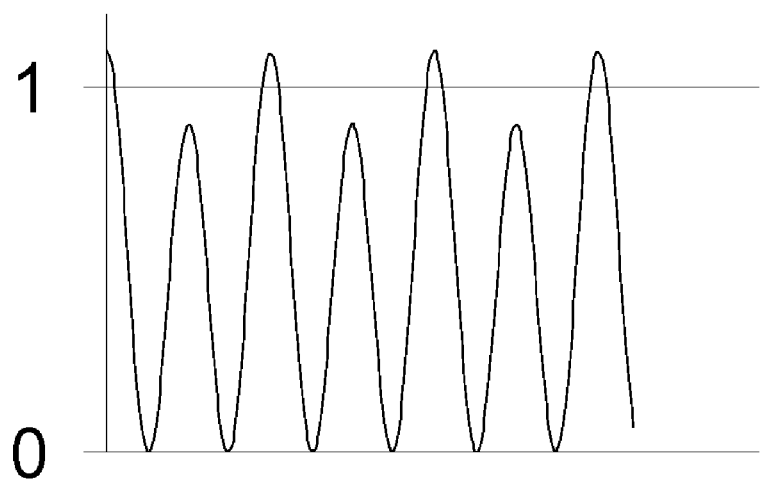
FIG. 8a is an aerial image at negative defocus.
Figure 8B:
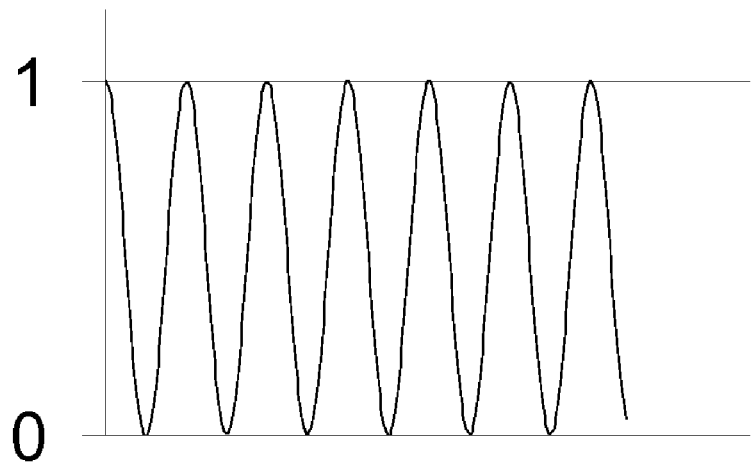
FIG. 8b shows the aerial image at best focus.
Figure 8C:
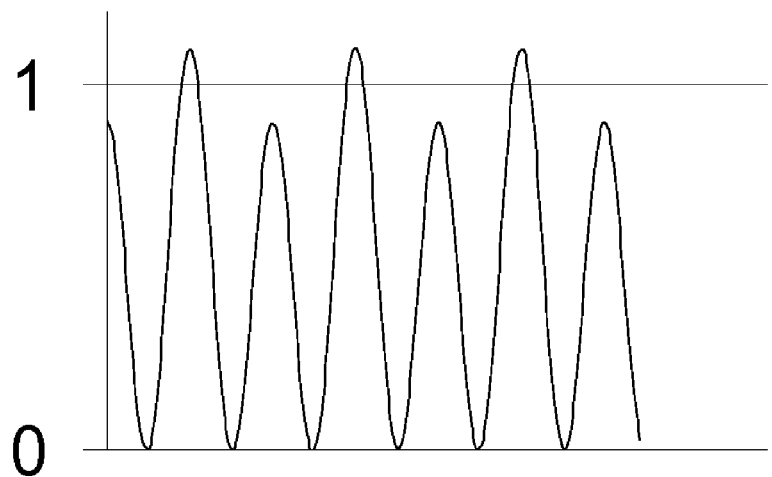
FIG. 8c shows an aerial image at positive defocus.

The asymmetry between the two types of images, real and ghost, will increase linearly with the amount of defocus. FIG. 7 is a plot of asymmetry vs. focus and specifically identifies 3 examples of asymmetry vs. focus as circles 8a, 8b, and 8c. FIG. 8a represents the aerial image of a negative defocus image and FIG. 8c shows an aerial image of a positive defocus image. FIG. 8b represents a calibrated attenuation phase shift mask, which is at 0 defocus or best focus. Measurement of this through-focus asymmetry can be used as a sensitive measurement of the effective phase of attenuating phase masks, measured at the lithographic pitch of interest, with the correct wavelength, numerical aperture, and illumination coherence.

Figure 9:
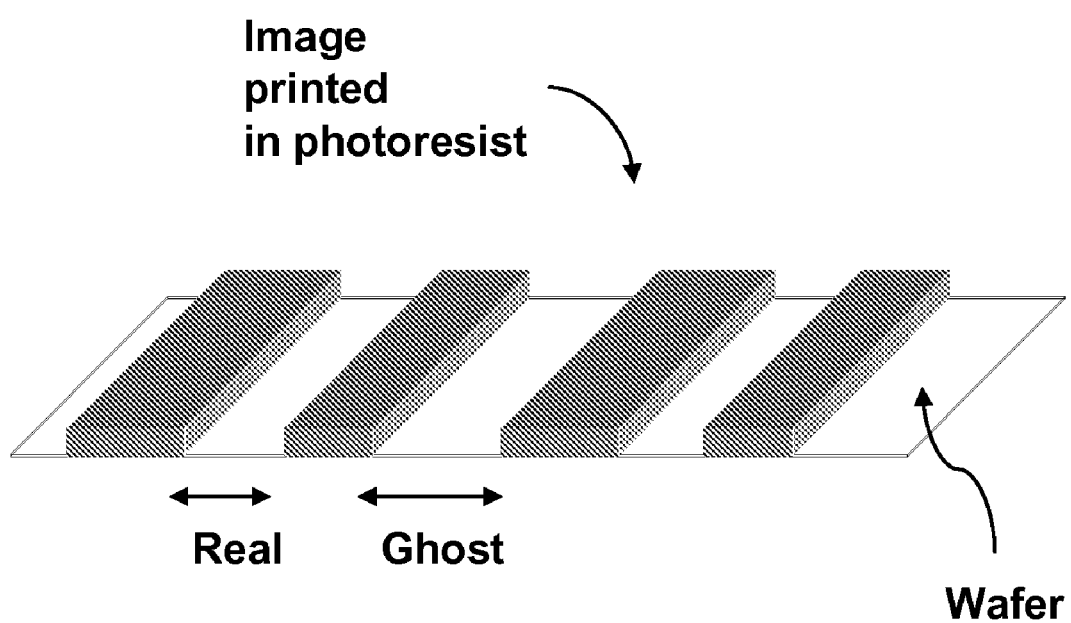
FIG. 9 is a method of measuring asymmetry using measured space widths in photoresist.

FIG. 9 shows another method of determining asymmetry. In this method, a printed image is measured for a dimension of real image and a dimension of ghost image. The asymmetry parameter is calculated by subtracting the ghost image's dimension from the real image's dimension and normalizing to the sum of the two dimensions as shown in the following equation 2:

$$\text{Asymmetry} = (X_{ghost} - X_{real})/(X_{ghost} + X_{real}) \quad \text{(eq. 2)}$$

Figure 10A:
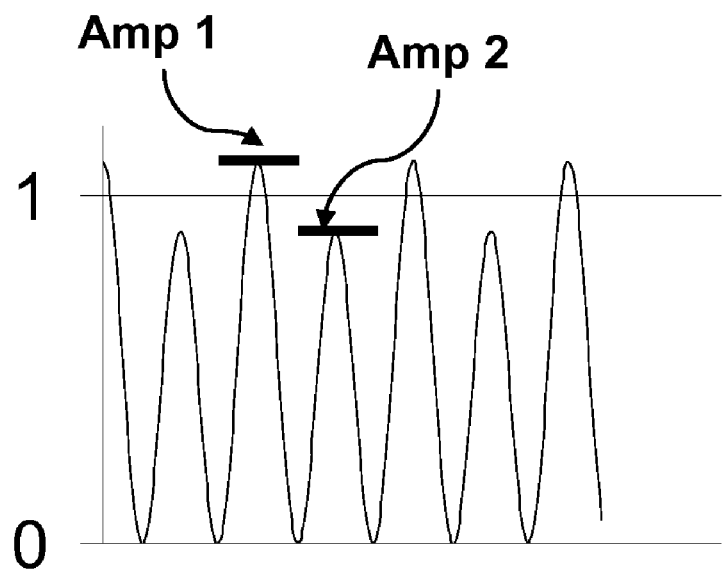
FIG. 10a is a method of measuring asymmetry using amplitude differentials in an aerial image.
Figure 10B:
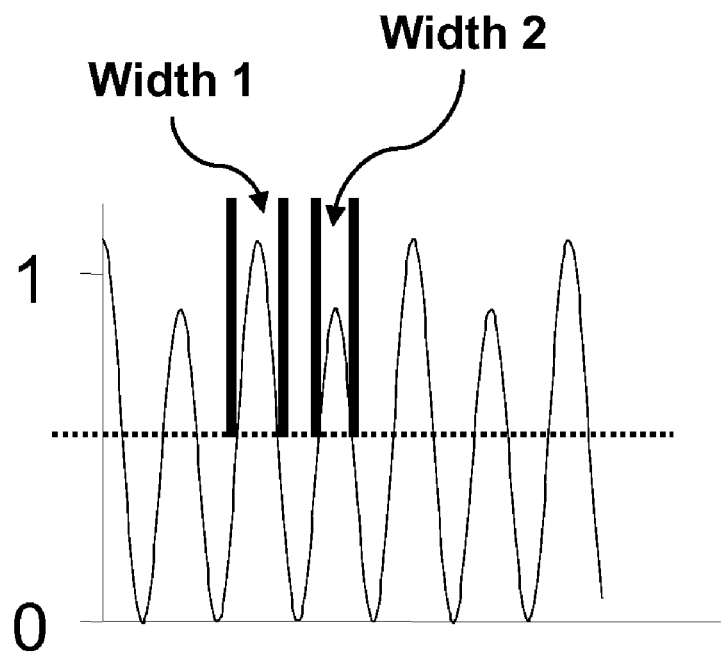
FIG. 10b is a method of measuring asymmetry using width differentials in an aerial image.

FIGS. 10a and 10b show yet another method of determining asymmetry. FIG. 10a shows the asymmetry measurement calculation as the differential between a first and second peak amplitude. FIG. 10b shows an asymmetry measurement calculation as a differential between a first and second peak width (taken from a common amplitude level).

Figure 11:
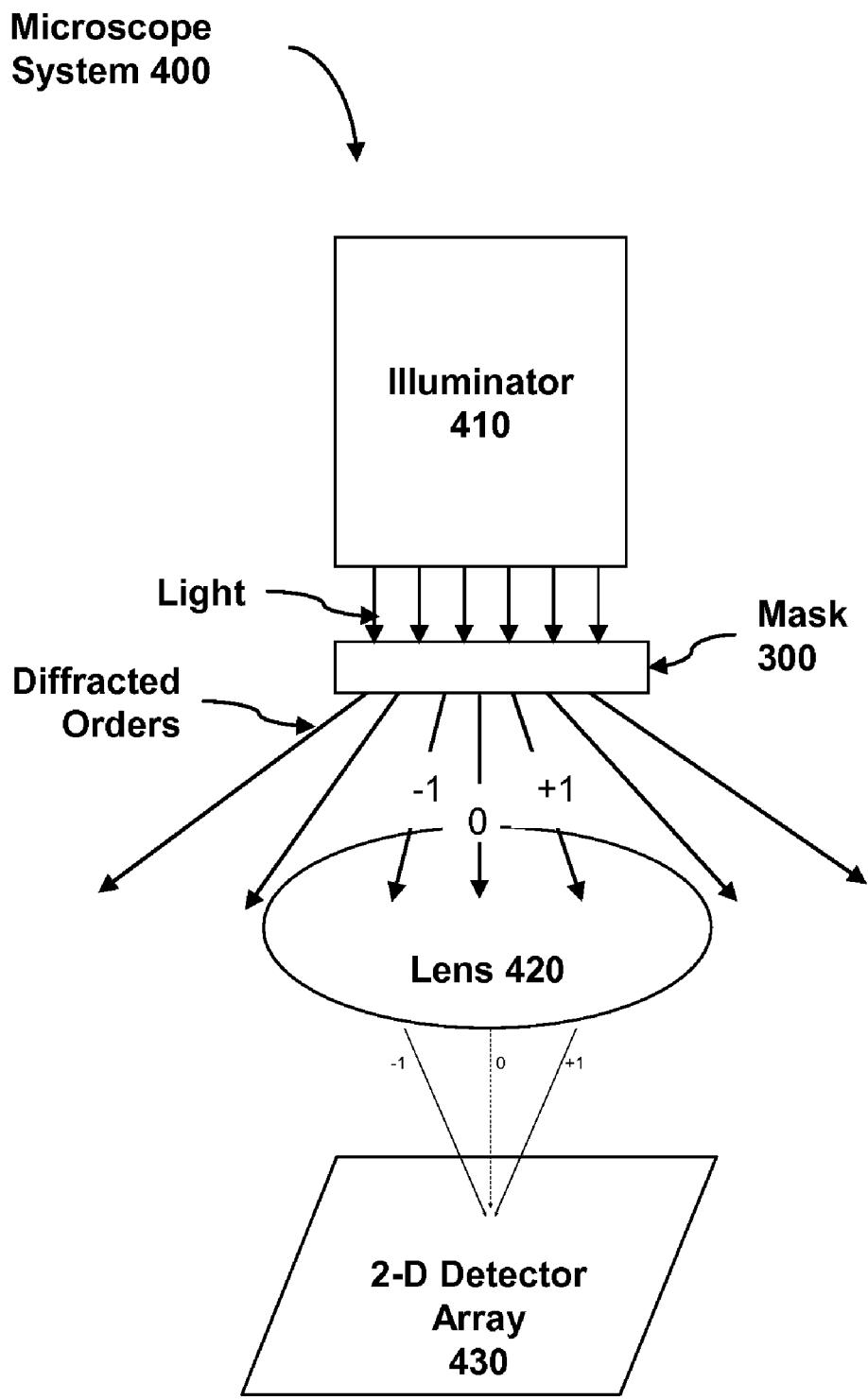
FIG. 11 is an apparatus for performing attenuating phase shift calibration using a microscope.

FIG. 11 shows preferred embodiment apparatus and method for calibrating phase shift in an attenuated phase shift mask using a microscope system 400 for accurately measuring phase calibration using the test structure of the present invention. Microscope system 400 includes an illuminator 410 which illuminates test structure 300. Test structure 300 further produces diffracted orders, some of which pass through lens 420 and finally converge on 2-D detector array 430. An example of microscope system 400 is an aerial image measurement system (AIMS) available from Carl Zeiss, Inc.

In operation, microscope system 400 captures the diffracted image using lens 420 and displays the aerial image graphically on a monitor (not shown) viewable by a technician.

Figure 12:
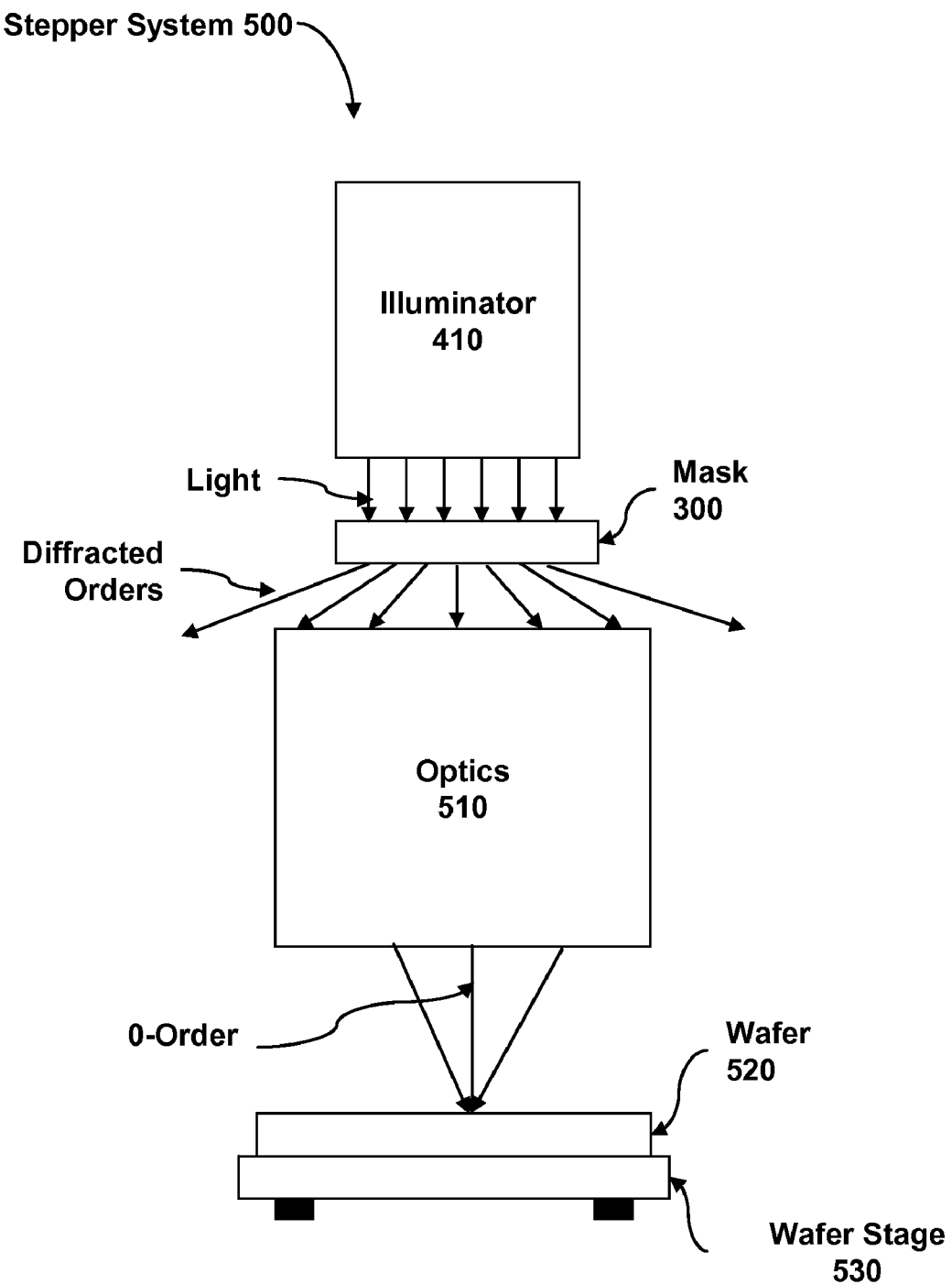
FIG. 12 is an apparatus for performing attenuating phase shift calibration using a lithographic stepper.

FIG. 12 shows a second embodiment of the present invention. FIG. 12 illustrates a stepper system 500 for accurately measuring phase shift of attenuated masks. Stepper system 500 includes illuminator 410, test structure 300, which produces diffracted orders, some of which are captured by optics 510. Optics 510 converges some of the diffracted orders onto a wafer 520, which is supported by a wafer stage 530. The photoresist image printed on wafer 520 is measured according to the method described in FIG. 9 where the real and ghost image dimensions are used to calculate the phase.

Figure 13:
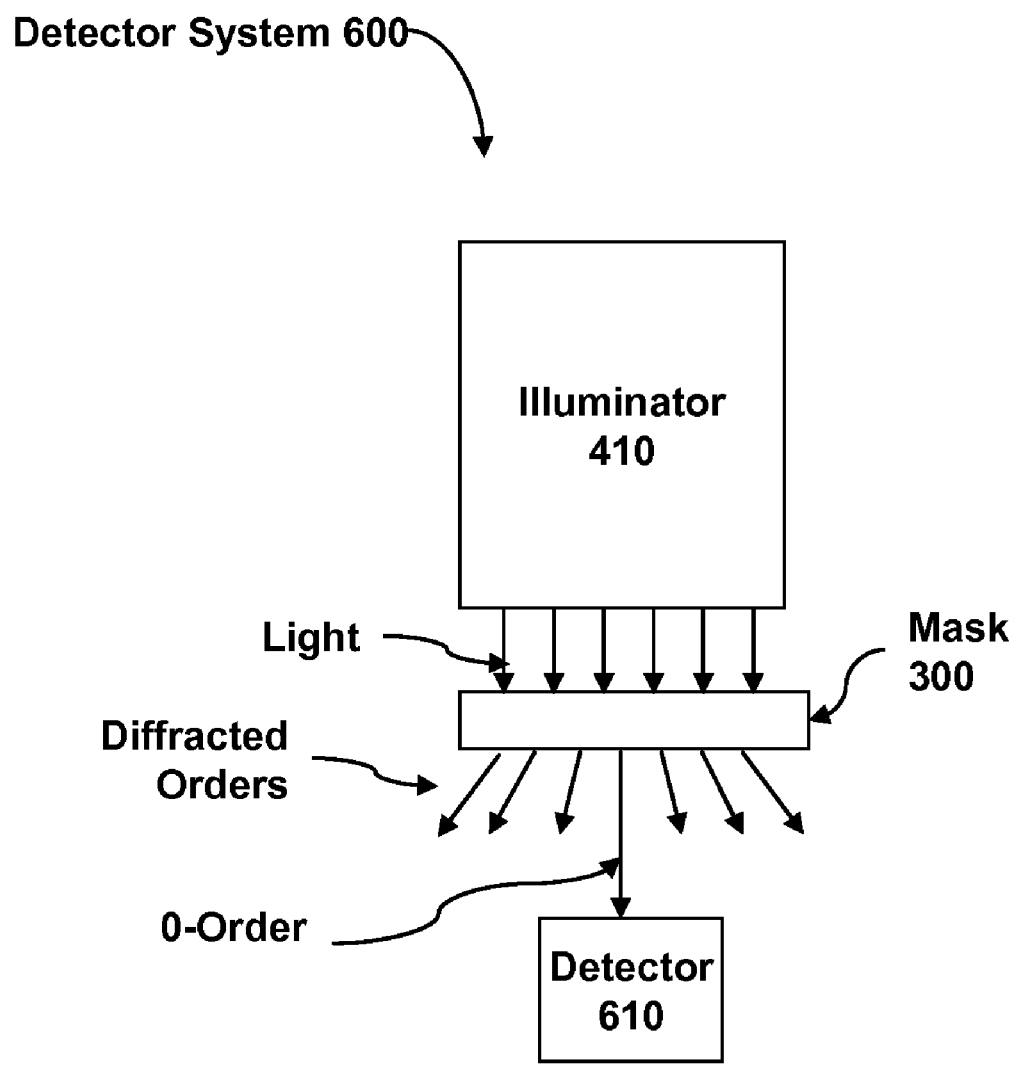
FIG. 13 shows an apparatus for taking a direct measurement for calibrating an attenuating phase shift mask.

FIG. 13 shows a third embodiment of the present invention using a direct measurement of the 0-order diffraction using a detector system 600. Detector system 600 includes illuminator 410, test structure 300, multiple diffracted orders and a detector 610 which collects and measures the zero-order diffraction to determine phase. In operation, if detector 610 does not detect any zero-order diffraction then test structure 300 is properly calibrated. If detector 610 does detect zero-order diffraction then test structure 300 exhibits either a lack of amplitude transmission balance between the 0° and 180° phase regions or a phase which does not exactly equal 180°.

In accordance with the present invention, an example attenuated phase shifting test structure 300 was built containing a number of test structures to evaluate the above mentioned methods of measuring phase. In this example, wafer-scale dimensions are used. The actual mask dimensions are greater by a factor of 4.

The test structures were a series of line/space gratings designed at (wafer-scale) pitches of 350, 375, 400, and 425 nm. At each pitch, a space to line ratio of approximately 0.25:1.00 was used. Additional gratings were built, varying the space to line ratio in several 5 nm increments on both sides of the calculated nominal value. The gratings were approximately 6 μm by 6 μm square.

Aerial images of the gratings were recorded using a 193 nm AIMS microscope with 0.72 NA and 0.305 sigma. This combination of settings was used to ensure that most of the $\pm 1^{st}$ order diffracted light was captured within the lens aperture for all of the grating pitches being used. In this example, only the results of the 350 nm pitch gratings will be discussed. Images were captured with 7 focus steps of 125 nm at wafer scale. At each focal step, the difference between the peak intensities of the true images and the ghost images was measured, normalized to the mean peak-to-valley amplitude, and the asymmetry was calculated.

Figure 14:
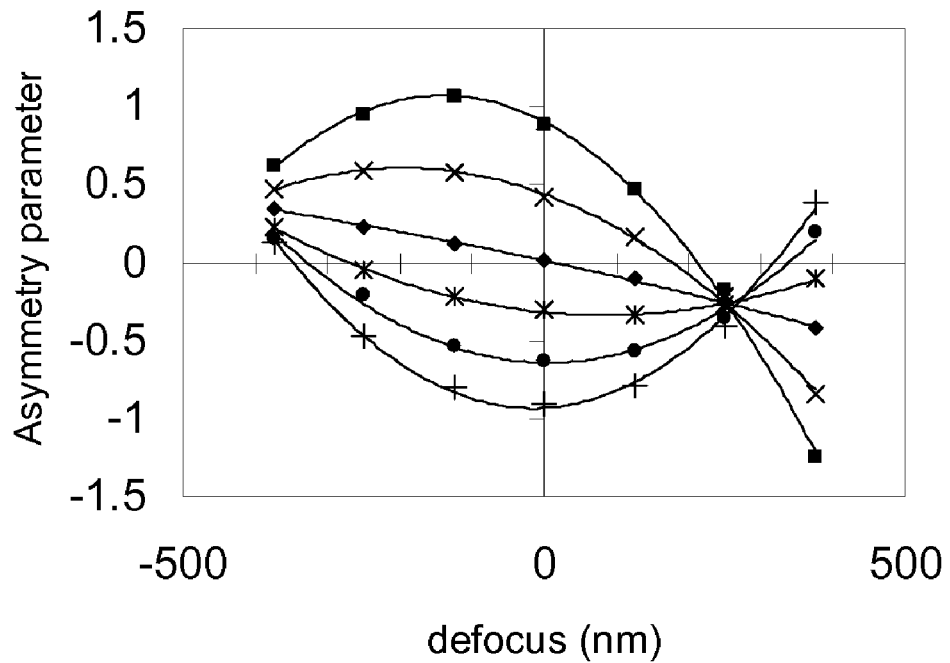
FIG. 14 is an exemplary graph showing asymmetry parameter vs. defocus for 6 space:line ratios at 350 nm pitch.

When the asymmetry was plotted against focus, the data yielded a straight line for a space:line ratio of 75:275 (pitch=350 nm). The non-zero slope of this line was caused by an error in the effective phase. The other space:line ratios give parabolic fits to the data as shown in FIG. 14. FIG. 14 shows a graph of the asymmetry parameter vs. defocus for 6 space:line ratios at 350 nm pitch. From top to bottom the space:line ratios are 65:285, 70:280, 75:275, 80:270, 85:265, and 90:260.

If the cancellation of the zero diffraction order fails because of a phase error, then the aerial image asymmetry will vary linearly with defocus, and at best focus the asymmetry is zero. However, if the zero order cancellation fails because of an amplitude mismatch between the 0° and 180° transmitted light, the asymmetry will vary quadratically with defocus and the maximum asymmetry will occur at best focus. A combination of phase error and amplitude mismatch gives a quadratic curve that is not centered about best focus.

Figure 15:
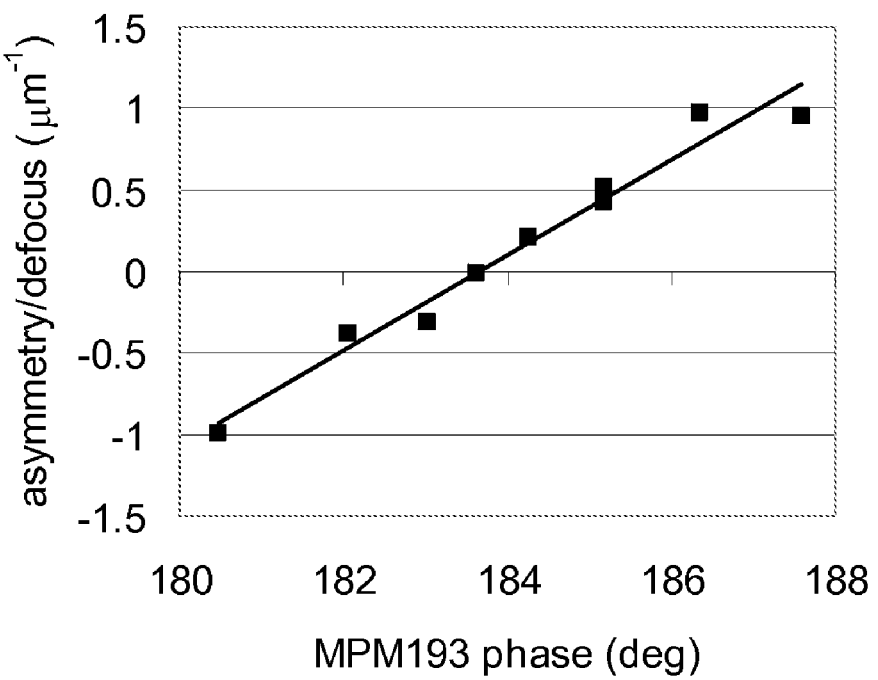
FIG. 15 is an exemplary graph showing several asymmetry/defocus slopes for gratings with different values of phase as measured on an MPM193 phase measurement system.

The results are shown in FIG. 15. FIG. 15 shows the asymmetry/defocus slope for gratings with several different values of phase as measured on a Lasertec MPM193 phase measurement system. There is a clear linear relationship between the asymmetry/defocus slope and the MPM193-measured phase, with a fitted linear coefficient of 0.29 μm-1 deg-1.

The above description and drawings are only to be considered illustrative of exemplary embodiments, which achieve the features and advantages of the invention. It should be appreciated by one of ordinary skill in the art that modification and substitutions to specific process conditions, systems, methods of testing, and structures can be made without departing from the spirit and scope of the invention. Accordingly, the invention is not to be considered as being limited by the foregoing description and drawings.

What is claimed is:

1. A method for measuring the phase error of an attenuated phase-shift mask, comprising the steps of:
   providing a test structure; and
   measuring the amplitude of the zero order diffraction of the structure;
   wherein the test structure is a pattern etched into an absorber material on a mask.

2. The method of claim 1 wherein the intensity of the zero order diffraction is directly measured with an optical intensity meter.

3. The method of claim 1 wherein the zero-order diffraction amplitude is measured by calculating the asymmetry of the aerial image through focus.

4. The method of claim 3 wherein the asymmetry is measured as the difference between at least one real and at least one ghost image peak divided by the average amplitude.

5. The method of claim 3 wherein the asymmetry is measured as the difference between the widths of the real and ghost images.

6. The method of claim 3 wherein the asymmetry is measured as the ratio of the width of the real image to the width of the ghost image.

7. The method of claim 3 wherein the asymmetry is measured as the difference between the widths of the real and ghost images printed in photoresist.

8. The method of claim 3 wherein the asymmetry is measured as the ratio between the width of the real image and the width of the ghost image printed in photoresist.

9. A test structure comprising:
   At least 2 regions having equal transmission amplitude; and
   a phase difference of about 180 degrees,
   wherein the test structure is etched into an absorber film on a mask; and
   the film having uniform transmission.

10. The structure of claim 9, wherein the light intensity transmitted through the first region differs from the light intensity transmitted through the second region and the transmission amplitude of the first region is equal to the transmission amplitude of the second region.

11. The structure of claim 9 wherein the test structure is patterned.

12. The structure of claim 9 wherein the test structure is linear.

13. The structure of claim 12 wherein the linear test structure is spatially periodic.

14. The structure of claim 9, wherein the structure comprises spaces and optically attenuating lines.

15. The structure of claim 14, wherein the ratio between the spaces and line widths is approximately equal to the optical transmission amplitude of the lines.

16. The test structure of claim 14, wherein the spaces are transparent.

* * * * *

UNITED STATES PATENT AND TRADEMARK OFFICE
CERTIFICATE OF CORRECTION

PATENT NO. : 7,642,016 B2 Page 1 of 1
APPLICATION NO. : 11/276232
DATED : January 5, 2010
INVENTOR(S) : Hibbs et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 855 days.

Signed and Sealed this

Sixteenth Day of November, 2010

David J. Kappos
*Director of the United States Patent and Trademark Office*